United States Patent
Yang et al.

(10) Patent No.: US 9,690,405 B2
(45) Date of Patent: Jun. 27, 2017

(54) DISPLAY PANEL AND MANUFACTURING METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 24 days.

(21) Appl. No.: 14/397,545

(22) PCT Filed: Dec. 3, 2013

(86) PCT No.: PCT/CN2013/088437
§ 371 (c)(1),
(2) Date: Oct. 28, 2014

(87) PCT Pub. No.: WO2015/018146
PCT Pub. Date: Feb. 12, 2015

(65) Prior Publication Data
US 2015/0301666 A1 Oct. 22, 2015

(30) Foreign Application Priority Data
Aug. 7, 2013 (CN) .......................... 2013 1 0346410

(51) Int. Cl.
G06F 3/041 (2006.01)
G02F 1/1333 (2006.01)
H01L 27/32 (2006.01)

(52) U.S. Cl.
CPC .......... *G06F 3/0412* (2013.01); *G02F 1/1333* (2013.01); *G02F 1/13338* (2013.01);
(Continued)

(58) Field of Classification Search
CPC ............... G02F 1/1333; G02F 1/13338; G02F 2001/133334; G06F 2203/04103; G06F 3/041; G06F 3/0412; H01L 27/323
(Continued)

(56) References Cited

U.S. PATENT DOCUMENTS

2005/0230757 A1* 10/2005 Nagasawa ......... G02F 1/136204
257/355
2010/0265206 A1* 10/2010 Chen .................... G06F 3/0412
345/174
(Continued)

FOREIGN PATENT DOCUMENTS

CN 1931924 A 3/2007
CN 101201490 A 6/2008
(Continued)

OTHER PUBLICATIONS

The First Office Action dated Sep. 25, 2015 corresponding to Chinese application No. 201310346410.7.
(Continued)

*Primary Examiner* — Tony Davis
(74) *Attorney, Agent, or Firm* — Nath, Goldberg & Meyer; Joshua B. Goldberg; Christopher Thomas

(57) ABSTRACT

The present invention provides a display panel, a manufacturing method thereof, and a display device. The display panel is divided into display areas and non-display areas, and comprises an upper base plate and a lower base plate which is aligned with the upper base plate to form a cell, a control structure and a display structure are arranged in the display area on the lower base plate, a sensing structure is
(Continued)

further arranged in the display area on the upper base plate and/or the lower base plate, the sensing structure and the display structure are correspondingly arranged, and a stabilizer sub-structure is arranged in the sensing structure.

19 Claims, 4 Drawing Sheets

(52) U.S. Cl.
CPC ............ *G06F 3/041* (2013.01); *H01L 27/323* (2013.01); *G02F 2001/133334* (2013.01); *G06F 2203/04103* (2013.01)

(58) Field of Classification Search
USPC .................................................. 345/173–174
See application file for complete search history.

(56) References Cited

U.S. PATENT DOCUMENTS

| | | | | |
|---|---|---|---|---|
| 2010/0310809 | A1* | 12/2010 | Jiang ......................... | B32B 7/06 428/41.8 |
| 2011/0069030 | A1* | 3/2011 | Nozawa ................ | G06F 3/0412 345/173 |
| 2012/0040478 | A1* | 2/2012 | Takeuchi ............ | H01L 27/3246 438/23 |
| 2012/0146922 | A1* | 6/2012 | Kang ...................... | G06F 3/044 345/173 |
| 2012/0319976 | A1* | 12/2012 | Ahn ......................... | G06F 3/045 345/173 |
| 2013/0057495 | A1* | 3/2013 | Wang ...................... | G06F 3/044 345/173 |
| 2013/0169569 | A1* | 7/2013 | Shih ......................... | G06F 3/041 345/173 |

FOREIGN PATENT DOCUMENTS

| | | |
|---|---|---|
| CN | 101781091 A | 7/2010 |
| CN | 102122223 A | 7/2011 |
| CN | 202102393 U | 1/2012 |
| CN | 202443214 U | 9/2012 |
| CN | 102830555 A | 12/2012 |
| CN | 102929031 A | 2/2013 |
| CN | 202841827 U | 3/2013 |
| CN | 103064569 A | 4/2013 |
| CN | 103218094 A | 7/2013 |
| TW | 500938 B | 9/2002 |
| TW | 200636637 A | 10/2006 |

OTHER PUBLICATIONS

Written Opinion of the International Searching Authority dated May 27, 2014 corresponding to International application No. PCT/CN2013/088437.

Search Report issued in International Application No. PCT/CN2013/088437, twelve (12) pages.

2nd office action issued in Chinese application No. 201310346410.7 dated Jan. 8, 2016.

* cited by examiner

DISPLAY PANEL AND MANUFACTURING METHOD THEREOF, AND DISPLAY DEVICE

This is a National Phase Application filed under 35 U.S.C. 371 as a national stage of PCT/CN2013/088437, filed Dec. 3, 2013, and claims priority benefit from Chinese Application No. 201310346410.7, filed Aug. 7, 2013, the content of each of which is hereby incorporated by reference in its entirety.

FIELD OF THE INVENTION

The present invention relates to the technical field of display, and in particular to a display panel and manufacturing method thereof, and a display device.

BACKGROUND OF THE INVENTION

In the technical field of panel display, organic light-emitting diode (OLED) display devices and liquid crystal display devices (LCD) are widely applied because of having the characteristics of light weight, thinness, electricity saving and the like. At present, people are trying hard to add the touch control function in the OLED or LCD display devices better, and some achievements have been already got.

The structure of a touch-screen display panel is as follows: a photosensitive sensor is added in an OLED display device, and the instructions of a user are identified through light ray changes detected by the photosensitive sensor, thus realizing the touch control function of a touch screen. However, the photosensitive sensor in the structure is high in cost, and is not beneficial to popularized application.

The structure of another touch-screen display panel is as follows: a substrate is adopted, a display structure is arranged on one surface of the substrate, a touch sensing structure is arranged on the other surface of the substrate, and the touch sensing structure is a sensing film layer formed from an indium tin oxide material. Because the sensing film layer formed from the indium tin oxide material is arranged on the surface of the display panel, and indium tin oxide is a conductive material, the display panel is usually subjected to external electromagnetic interference with different degrees, and then the display performance of the display panel is instable; in addition, the sensing film layer arranged on the surface of the substrate is quite liable to be damaged by a collision, thus the touch control function cannot be normally used.

It can be seen that, how to designing a display panel with a touch control function, which has a low cost and an excellent stability, already becomes a technical problem urgently needing to be solved presently.

SUMMARY OF THE INVENTION

Embodiments of the present invention provide a display panel and manufacturing method thereof, and a display device aiming at the technical problem above existing in the prior art. According to the display panel, by arranging a stabilizer sub-structure in the sensing structure, the display panel with the touch control function is more stable in performance; in addition, according to the manufacturing method, the thinness of the display panel is realized with a low cost.

One embodiment of the present invention provides a display panel which is divided into display area and non-display area, and comprises an upper base plate and a lower base plate which is aligned with the upper base plate to form a cell, wherein a control structure and a display structure are arranged in the display area on the lower base plate, a sensing structure is further arranged in the display area on the upper base plate and/or the lower base plate, the sensing structure and the display structure are correspondingly arranged, and a stabilizer sub-structure is arranged in the sensing structure.

Preferably, the upper base plate comprises a second substrate, the lower base plate comprises a first substrate, the control structure is arranged above the first substrate, and the display structure is arranged above the control structure; the sensing structure comprises a first sensing structure, and the first sensing structure is arranged in the lower base plate, and located at a side of the first substrate away from the display structure; or, the first sensing structure is arranged in the upper base plate, and located at a side of the second substrate close to the display structure or at a side of the second substrate away from the display structure; or, the sensing structure comprises a first sensing structure and a second sensing structure, both of the first sensing structure and the second sensing structure are arranged in the upper base plate, the first sensing structure is located at the side of the second substrate close to the display structure, and the second sensing structure is located at the side of the second substrate away from the display structure; or, the sensing structure comprises a first sensing structure and a second sensing structure, the first sensing structure is arranged in the upper base plate, and located at the side of the second substrate away from the display structure or at the side of the second substrate close to the display structure, and the second sensing structure is arranged in the lower base plate, and located at the side of the first substrate away from the display structure.

Preferably, the control structure is a thin film transistor layer, and the display structure is an organic light emitting layer or a liquid crystal layer.

Preferably, the first sensing structure and the second sensing structure comprise a sensing film layer and the stabilizer sub-structure which are sequentially arranged in a direction away from the first substrate or the second substrate, wherein the sensing film layer is formed from carbon nanotubes or an indium tin oxide material, and the stabilizer sub-structure is a protection layer formed from an organic material; or, the first sensing structure and the second sensing structure comprise two split sensing film layers and the stabilizer sub-structure which are sequentially arranged in a direction away from the first substrate or the second substrate, wherein an insulation layer is further arranged between the two split sensing film layers, the two split sensing film layers are formed from carbon nanotubes and an indium tin oxide material respectively, or formed from carbon nanotubes and a graphene material respectively, the stabilizer sub-structure is a protection layer formed from an organic material, and the insulation layer is formed from an insulation material capable of making the two split sensing film layers mutually insulated.

Preferably, an upper polarization sheet is arranged at a side of the upper base plate away from the display structure, and/or a lower polarization sheet is arranged at a side of the lower base plate away from the display structure.

Preferably, the display panel further comprises peripheral circuits, wherein the display area of the upper base plate and the display area of the lower base plate are the same in dimensions, the non-display area of the upper base plate and the non-display area of the lower base plate are also the same in dimensions, and moreover, the non-display area is only arranged at one side of the display area, and the upper base plate and the lower base plate are arranged in a staggered manner, thus the display area of the upper base plate corresponds to the display area of the lower base plate in an orthographic projection direction, the non-display area of the upper base plate and the non-display area of the lower base plate are exposed at the two opposite sides, and the peripheral circuits are arranged in the exposed non-display areas; or, the length and/or the width of the lower base plate is greater than the length and/or the width of the upper base plate, thus the non-display area of the lower base plate is exposed, and the peripheral circuits are arranged in the exposed non-display area of the lower base plate.

Preferably, the first substrate and the second substrate are formed from a transparent glass material, the first substrate and/or the second substrate is subjected to thinning treatment through a chemical thinning process, and the thickness range of the first substrate and the second substrate is 0.1-0.3 mm.

Preferably, the organic light emitting layer at least comprises an anode layer, a light emitting layer and a cathode layer; the liquid crystal layer is formed by filling liquid crystal in a gap formed by aligning the upper base plate and the lower base plate to form a cell.

One embodiment of the present invention further provides a display device, comprising the display panel above.

One embodiment of the present invention further provides a manufacturing method for a display panel which is divided into display areas and non-display areas, and the manufacturing method comprises: a step of forming an upper base plate and a lower base plate respectively; and a step of aligning the upper base plate and the lower base plate to form a cell so that the display panel is formed, wherein a control structure and a display structure are formed in the display area on the lower base plate, a sensing structure is further formed in the display area on the upper base plate or the lower base plate, the sensing structure and the display structure are correspondingly arranged, and a stabilizer sub-structure is formed in the sensing structure.

Preferably, the step of forming the lower base plate specifically comprises: preparing a first substrate; and forming a pattern comprising the control structure on the first substrate; or, after forming the pattern comprising the control structure, a step is further comprised: forming a pattern comprising the sensing structure at a side of the first substrate away from the control structure.

Preferably, the step of forming the upper base plate specifically comprises: preparing a second substrate, or, a step is further comprised: forming a pattern comprising the sensing structure at one side or both sides of the prepared second substrate.

Preferably, the step of forming the display panel specifically comprises: applying a frame-sealing material in the edge area of the non-display area of the lower base plate or the upper base plate; aligning the upper base plate with the lower base plate to form a cell after applying the frame-sealing material; attaching polarization sheets at the outer sides of the upper base plate and/or the lower base plate respectively; and attaching peripheral circuits in the exposed non-display areas of the upper base plate and/or the lower base plate.

Preferably, the control structure is a thin film transistor layer, the display structure is an organic light emitting layer, and after the step of forming a pattern comprising the control structure, the manufacturing method further comprises: forming the organic light emitting layer above the control structure in a vacuum evaporation environment by means of evaporation; or, the display structure is a liquid crystal layer, and after applying the frame-sealing material and before aligning the upper base plate and the lower base plate to form a cell, the manufacturing method further comprises: dripping liquid crystal in the display area of the upper base plate or the lower base plate.

Preferably, the step of forming the display panel further comprises: after aligning the upper base plate and the lower base plate to form a cell and before forming the sensing structure at the side of the first substrate away from the display structure and/or forming the sensing structure at the side of the second substrate away from the display structure, a step of thinning the side of the first substrate away from the display structure in the lower base plate and/or the side of the second substrate away from the display structure in the upper base plate, and the thinning step specifically comprises: applying a protection material in the non-display areas between the upper base plate and the lower base plate, wherein the protection material is a thermocuring material or a photocuring material; thinning the side of the first substrate away from the display structure in the lower base plate and/or the side of the second substrate away from the display structure in the upper base plate by a chemical thinning process; and removing the protection material.

Preferably, the sensing structure comprises: a sensing film layer and a stabilizer sub-structure which are sequentially arranged in a direction away from the first substrate or the second substrate, the stabilizer sub-structure is a protection layer formed from an organic material, and the step of forming the sensing structure comprises: forming a pattern comprising the sensing film layer by carbon nanotubes through a drawing process; or forming a pattern comprising the sensing film layer by an indium tin oxide material through a patterning process; and applying an organic material on the sensing film layer to form the protection layer; or, the sensing structure comprises: two split sensing film layers and the stabilizer sub-structure which are sequentially arranged in a direction away from the first substrate or the second substrate, the stabilizer sub-structure is a protection layer formed from an organic material, an insulation layer is further arranged between the two split sensing film layers, and the step of forming the sensing structure comprises: forming a pattern comprising a first split sensing film layer by an indium tin oxide material or graphene through a patterning process; forming the insulation layer above the first split sensing film layer through applying; forming a pattern comprising a second split sensing film layer above the insulation layer by a carbon nanotube material through a drawing process; and forming the protection layer above the second split sensing film layer through applying an organic material.

Preferably, before the step of forming the pattern comprising the second split sensing film layer, the manufacturing method further comprises a pre-baking step, wherein a pre-baking temperature range is 60-90° C., and a pre-baking time range is 2-3 minutes; and/or after the step of forming the pattern comprising the second split sensing film layer, the manufacturing method further comprises a post-baking step, wherein a post-baking temperature range is 80-120° C., and a post-baking time range is 15-30 minutes.

BRIEF DESCRIPTION OF THE DRAWINGS

FIG. 3A is a sectional view of a first substrate.

FIG. 3B is a sectional view of forming a control structure on the first substrate.

FIG. 3C is a sectional view of forming a display structure on the control structure.

FIG. 3D is a sectional view of a second substrate.

FIG. 3E is a sectional view of forming a sensing structure on the second substrate.

FIG. 3F is a sectional view of aligning an upper base plate and a lower base plate to form a cell.

FIG. 3G is a sectional view after aligning the upper base plate and the lower base plate to form a cell and thinning the first substrate and the second substrate.

FIG. 3H is a sectional view of attaching polarization sheets.

REFERENCE SIGNS 1. first substrate; 2. second substrate; 3. control structure; 4. display structure; 51. first sensing structure; 52. second sensing structure; 511. sensing film layer; 512. stabilizer sub-structure; 513. first split sensing film layer; 514. second split sensing film layer; 515. insulation layer; 61. upper polarization sheet; 7. frame-sealing material.

DETAILED DESCRIPTION OF THE EMBODIMENTS

In order to enable those skilled in the art to understand the technical solution of the present invention better, the display panel, the manufacturing method for the display panel, and the display device provided by the present invention are further described below in details in combination with the accompanying drawings and the specific implementations. It should be noted that, the thickness, the size and the like of each layer of the structure shown in the accompanying drawings are exemplary, aiming at merely illustrating the present invention, rather than reflecting dimensions in actual applications or even limiting the present invention.

Embodiment 1

The present embodiment provides a display panel, the display panel is divided into display areas and non-display areas, and comprises an upper base plate and a lower base plate which are aligned to combine together to form a cell, a control structure and a display structure are arranged in the display area on the lower base plate, a sensing structure is arranged in the display area on the upper base plate, the sensing structure and the display structure are correspondingly arranged, and a stabilizer sub-structure is arranged in the sensing structure.

Figure 1:
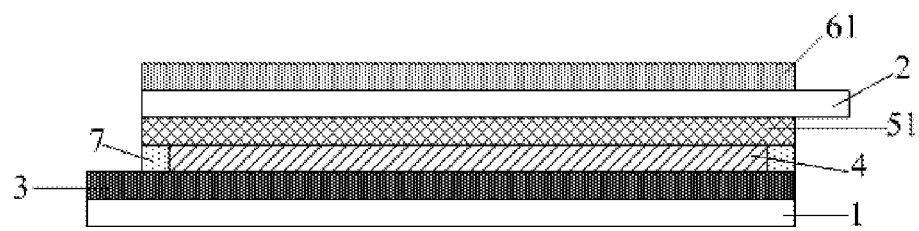
FIG. 1 is a sectional view of a display panel according to the embodiment 1 of the present invention.

FIG. 1 shows the sectional view of the display panel of the embodiment.

As shown in FIG. 1, the lower base plate of the display panel comprises a first substrate 1, a control structure 3 and a display structure 4 which are sequentially arranged in a stacking manner. The upper base plate of the display panel comprises a second substrate 2 and a first sensing structure 51 which are sequentially arranged in a stacking manner. In addition, the display panel further comprises a frame-sealing material 7 which is arranged at the periphery of the display structure 4, so as to bond the control structure 3 with the first sensing structure 51, and seal the display structure 4 among the control structure 3, the first sensing structure 51 and the frame-sealing material 7, thus the lower base plate and the upper base plate are mutually bonded. As a result, as shown in FIG. 1, a stacking structure sequentially comprising the first substrate 1, the control structure 3, the display structure 4 and the frame-sealing material 7, the first sensing structure 51, and the second substrate 2 from top to bottom is formed.

In addition, in some examples, an upper polarization sheet 61 used for increasing a contrast is further arranged at a side of the second substrate 2 away from the display structure 4 in the upper base plate, and the upper polarization sheet 61 is preferably a circular polarization sheet.

Preferably, the control structure 3 is a thin film transistor layer, and the display structure 4 is an organic light emitting layer. More preferably, the organic light emitting layer at least comprises an anode layer, a light emitting layer and a cathode layer.

Figure 2:
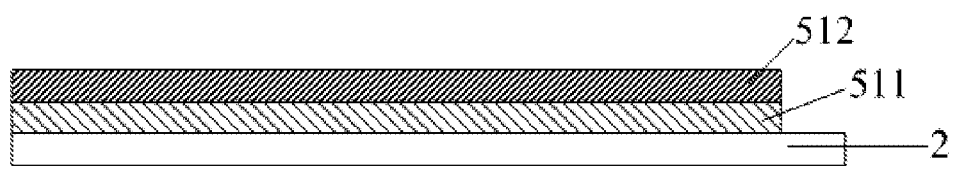
FIG. 2 is a sectional view of a sensing structure according to the embodiment 1 of the present invention.

The first sensing structure 51 is an example of the sensing structure of the present invention. As shown in FIG. 2, the first sensing structure 51 comprises a sensing film layer 511 and a stabilizer sub-structure 512 which are sequentially arranged in a direction away from the second substrate 2. That is, in the display panel provided by the present invention, a layer of the stabilizer sub-structure is arranged for the sensing film layer, which helps to the stability of the sensing film layer. Preferably, the stabilizer sub-structure and the sensing film layer may have a substantially same size, that is, the stabilizer sub-structure may substantially cover the whole surface of the sensing film layer. Preferably, the stabilizer sub-structure may be formed into a protection layer for sandwiching the sensing film layer between the stabilizer sub-structure and the second substrate, thus the sensing film layer is not liable to be damaged. The stabilizer sub-structure 512 may be formed from any proper material capable of protecting the sensing film layer. Preferably, the stabilizer sub-structure 512 may be formed from an anti-electromagnetic interference material, for example, an organic material. On one hand, the stabilizer sub-structure 512 formed from the organic material is capable of protecting the display panel from internal or external electromagnetic interference, thus guaranteeing the stable performance of the display panel; on the other hand, the stabilizer sub-structure 512 is sturdy and durable, and capable of well protecting the sensing film layer 511, thus enabling the sensing film layer 511 not liable to be damaged by a collision. Preferably, the sensing film layer 511 may be formed from carbon nanotubes or an indium tin oxide material.

Preferably, the first substrate 1 and the second substrate 2 may be formed from a transparent glass material. More preferably, the first substrate 1 and the second substrate 2 may be subjected to thinning treatment through a chemical thinning process, for example, the thickness range of the first substrate 1 and the second substrate 2 is enabled to be 0.1-0.3 mm. By virtue of such manner, the overall thickness increased due to the addition of the stabilizer sub-structure 512 can be reduced, and thus the display panel is thinner, beautiful and convenient to carry.

In some examples, the display panel further comprises peripheral circuits (not shown in FIG. 1). Preferably, the upper base plate and the lower base plate are arranged in a staggered manner, and the peripheral circuits are arranged in the non-display areas exposed by staggering the upper base plate and the lower base plate. Due to such arrangement, the arrangement of the peripheral circuits is more flexible and convenient, and the non-display areas of the display panel can be further reduced, thus facilitating the development of the display panel with a light weight and a small size.

Preferably, the display areas of the upper base plate and the lower base plate of the display panel have the same dimension, the non-display areas of the upper base plate and the lower base plate also have the same dimension, and the non-display area is only arranged at one side of the display area. During aligning the upper base plate and the lower base plate to form a cell, the display areas of the upper base plate and the lower base plate are correspondingly arranged in an orthographic projection direction, thus the non-display area of the upper base plate and the non-display area of the lower base plate are arranged at two opposite sides. Due to such manner, the display areas can be mutually corresponding with each other, and the non-display area of the upper base plate and the non-display area of the lower base plate can be exposed due to the staggering arrangement of the upper base plate and the lower base plate, thus the arrangement of the peripheral circuits in the non-display areas is more convenient.

The embodiment further provides a manufacturing method for manufacturing the display panel above. The manufacturing method comprises: a step of forming an upper base plate and a lower base plate respectively; and a step of aligning the upper base plate and the lower base plate to form a cell so as to form the display panel, wherein a control structure and a display structure are formed in the display area on the lower base plate, a sensing structure is formed in the display area on the upper base plate, the sensing structure are arranged to correspond to the display structure, and a stabilizer sub-structure is formed in the sensing structure.

The specific manufacturing process for the display panel of the embodiment is shown in FIG. 3A to FIG. 3H.

Firstly, the lower base plate is formed. The step of forming the lower base plate specifically comprises the following steps S10-S11.

Figure 3A:
FIG. 3A to FIG. 3H are flowcharts of a manufacturing method for the display panel according to the embodiment 1 of the present invention.

Step S10: preparing a first substrate 1 (as shown in FIG. 3A).

Figure 3B:
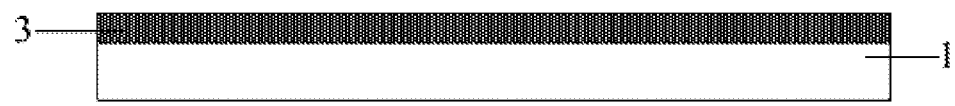

Step S11: forming a pattern comprising the control structure 3 on the first substrate 1 (as shown in FIG. 3B). Preferably, the control structure 3 is a thin film transistor layer.

Figure 3C:
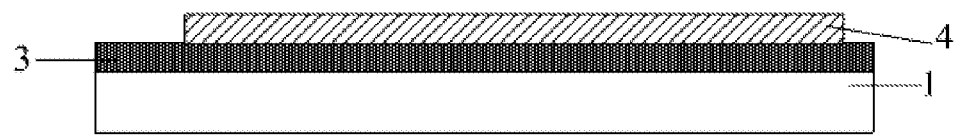

A step of forming the display structure 4 above the control structure 3 is further comprised after the step S11 (as shown in FIG. 3C). Preferably, the display structure 4 is an organic light emitting layer. The display structure 4 may be formed in a vacuum evaporation environment by means of evaporation.

So far, the preparation for the lower base plate is finished.

Then, the upper base plate is formed. The step of forming the upper base plate specifically comprises the following steps S20-S21.

Figure 3D:

Step S20: preparing a second substrate 2 (as shown in FIG. 3D).

Figure 3E:

Step S21: forming a pattern comprising the sensing structure (that is, the first sensing structure 51) at one side of the second substrate 2 (as shown in FIG. 3E). The sensing structure is formed at a side of the second substrate 2 close to the display structure 4 when the upper base plate and the lower base plate are aligned to form a cell. The sensing structure comprises a sensing film layer and a stabilizer sub-structure which are sequentially arranged in a direction away from the second substrate 2. Preferably, the stabilizer sub-structure is a protection layer formed from an organic material. The step of forming the sensing structure may specifically comprise the following steps S50-S51.

Step S50: forming a pattern comprising the sensing film layer. The pattern comprising the sensing film layer may be formed by carbon nanotubes through a drawing process. Alternatively, the pattern comprising the sensing film layer may also be formed by an indium tin oxide material through a patterning process.

Step S51: forming the stabilizer sub-structure as a protection layer on the sensing film layer. The stabilizer sub-structure may be formed from an organic material through an applying process. The stabilizer sub-structure is capable of protecting the display panel from internal or external electromagnetic interference, and well protecting the sensing film layer from damages due to a collision.

So far, the preparation for the upper base plate is also finished.

It should be noted that, the arrangement of the stabilizer sub-structure may increase the thickness of the display panel. Therefore, after the subsequent step of aligning the upper base plate and the lower base plate to form a cell, the step of thinning the first substrate and the second substrate may be performed, so as to reduce the overall thickness of the display panel.

It needs to be illustrated that, the preparation order of the upper base plate and the lower base plate is not limited. The lower base plate may be prepared at first and then the upper base plate is prepared, or the upper base plate may be prepared at first and then the lower base plate is prepared, or the upper base plate and the lower base plate are prepared simultaneously. That is, the preparation order of the upper base plate and the lower base plate may be decided flexibly according to equipment conditions or process conditions in the practical production process. In addition, when the upper base plate and the lower base plate are aligned to form a cell, the upper base plate and the lower base plate may be both already completely prepared, or the upper base plate and/or the lower base plate may be partially prepared (this case is mainly for later embodiments in which the arrangement position of the sensing structure is different from that of the sensing structure in this embodiment).

Then, the upper base plate and the lower base plate are aligned to form a cell so as to form the display panel. The step of aligning the upper base plate and the lower base plate to form a cell specifically comprises the following steps S30-S31.

Step S30: applying a frame-sealing material 7 in the edge area of the non-display area of the lower base plate.

The frame-sealing material 7 may be a low-melting-point glass powder slurry, and the melting temperature range thereof is 60-80° C. Of course, the frame-sealing material 7 may also be applied in the edge area of the non-display area of the upper base plate.

Figure 3F:
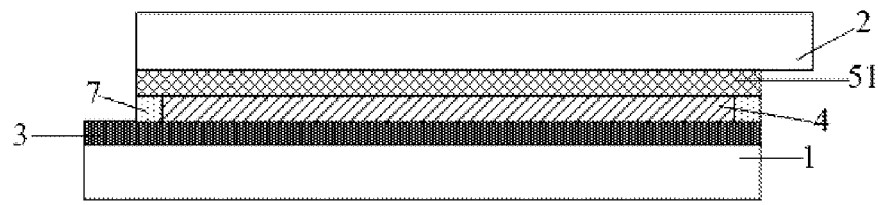

Step S31: after the step S30, aligning the upper base plate and the lower base plate to form a cell (as shown in FIG. 3F).

The upper base plate and the lower base plate are bonded together by virtue of the frame-sealing material 7.

Figure 3G:
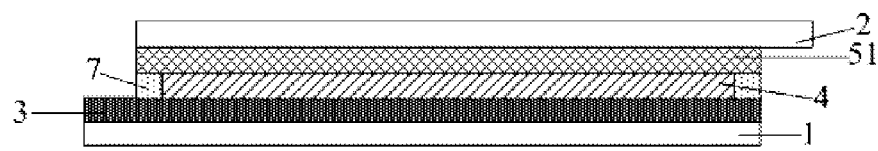

After the upper base plate and the lower base plate are aligned to form a cell, a step of thinning the side of the first substrate 1 away from the display structure 4 in the lower base plate and the side of the second substrate 2 away from the display structure 4 in the upper base plate may also be carried out (FIG. 3G shows the sectional view after the thinning step), and the thinning step specifically comprises the following steps S40-S42.

Step S40: applying a protection material in the non-display areas between the upper base plate and the lower base plate.

The protection material may be a thermocuring material or a photocuring material, and the material is capable of preventing the corrosion damages of chemical solution to the internal structures of the display panel such as the display structure, the control structure and the sensing structure, and the non-display areas exposed by the staggered arrangements of the upper base plate and the lower base plate, during the chemical thinning process.

Step S41: thinning the side of the first substrate 1 away from the display structure 4 in the lower base plate and the side of the second substrate 2 away from the display structure 4 in the upper base plate.

The thinning process above may be carried out by a chemical thinning process. The chemical thinning process mainly has two modes: one mode is soaking the upper base plate and lower base plate aligned to form a cell in mixed acid solution, carrying out chemical corrosion thinning on the first substrate 1 and the second substrate 2 by the mixed acid solution, and thinning the first substrate 1 and the second substrate 2 to be in a thickness range of 0.1-0.3 m respectively by controlling a soaking time and a soaking temperature; the other mode is spraying the upper base plate and lower base plate aligned to form a cell by mixed acid solution, and thinning the first substrate 1 and the second substrate 2 to be in a thickness range of 0.1-0.3 m respectively by controlling a spraying pressure, a spraying time, a spraying temperature and a spraying amount.

In the embodiment, the first substrate and the second substrate are thinned by the chemical thinning process. Because the chemical thinning process is mature and has a low cost, the thinning thicknesses of the first substrate and the second substrate can be easily controlled while the thinness of the display panel can be realized with a low cost.

Step S42: removing the protection material.

After the thinning step above is completed, the following steps S32-S33 are carried out, so as to finish the step of aligning the upper base plate and the lower base plate to form a cell.

Figure 3H:
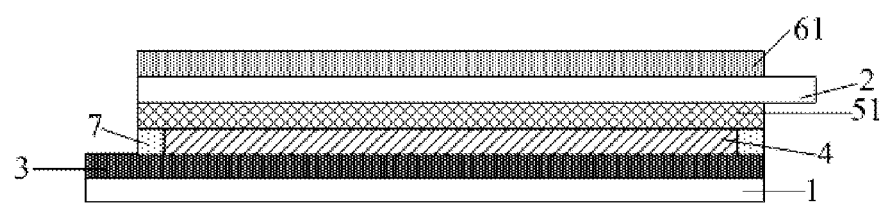

Step S32: attaching a polarization sheet (that is, the upper polarization sheet 61) at the outer side of the upper base plate (as shown in FIG. 3H).

Step S33: attaching peripheral circuits on the upper base plate and the lower base plate after completing the step S32.

On the basis of the structure of the display panel of the embodiment, the peripheral circuits are attached in the non-display areas of the upper base plate and the lower base plate, which are exposed due to the stagger of the upper base plate and the lower base plate.

So far, the manufacturing of the display panel is finished.

Embodiment 2

Figure 4:
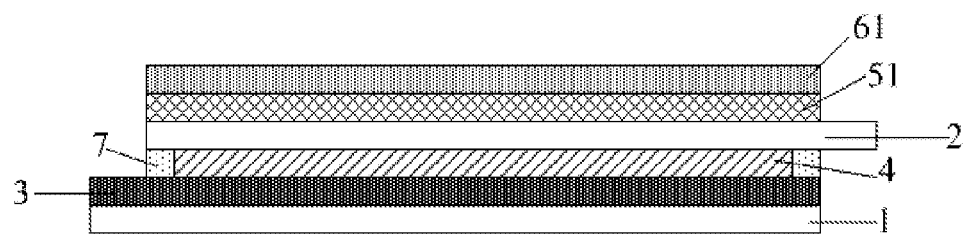
FIG. 4 is a sectional view of a display panel according to the embodiment 2 of the present invention.

The embodiment provides a display panel, which differs from the embodiment 1 in that, in the display panel of the present embodiment, as shown in FIG. 4, a first sensing structure 51 is located at a side of the second substrate 2 away from the display structure 4.

The embodiment further provides a manufacturing method for the display panel above, which differs from the manufacturing method in the embodiment 1 in that, in the manufacturing method of the present embodiment, before forming the pattern comprising the sensing structure (that is, the first sensing structure 51) on the second substrate 2, the second substrate 2 is aligned with the lower base plate to form a cell at first, and then the first substrate and the second substrate are thinned by a chemical thinning process. After the protection material is removed, the sensing structure is formed at the side of the second substrate 2 away from the display structure 4. Then, a polarization sheet (that is, the upper polarization sheet 61) is attached on the sensing structure.

The other structures, materials and manufacturing processes of the display panel of the present embodiment may be the same as those of the embodiment 1, which are not described redundantly herein.

Embodiment 3

Figure 5:
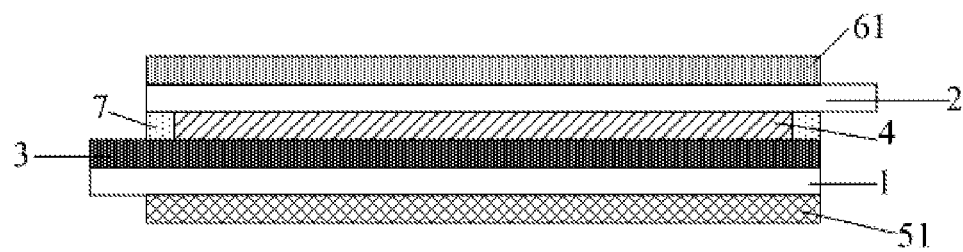
FIG. 5 is a sectional view of a display panel according to the embodiment 3 of the present invention.

The embodiment provides a display panel, which differs from the embodiments 1 and 2 in that, in the display panel of the present embodiment, as shown in FIG. 5, the first sensing structure 51 is arranged in the lower base plate, and located at a side of the first substrate 1 away from the display structure 4.

The embodiment further provides a manufacturing method for the display panel above, which differs from the manufacturing method in the embodiments 1 and 2 in that, in the manufacturing method of the present embodiment, in the preparation step for a lower base plate, after the step of forming the display structure 4 above the control structure 3, a step S12 is further comprised: forming a pattern comprising a sensing structure (that is, the first sensing structure 51) at the side of the first substrate 1 away from the control structure 3. Correspondingly, the step S21 of forming the sensing structure is not comprised in the preparation step for an upper base plate of the embodiment.

It needs to be illustrated that, the formation of the sensing structure is carried out after the upper base plate and the lower base plate are aligned to form a cell, whereas the step of aligning the upper base plate and the lower base plate to form a cell is carried out before the lower base plate is completely prepared. Specifically, when the control structure 3 and the display structure 4 are already formed in the lower base plate but the sensing structure is not formed, the upper base plate is aligned with the lower base plate, which is not completely prepared, to form a cell, and then the first substrate and the second substrate are thinned by a chemical thinning process. In this state, the sensing structure is formed at the side of the second substrate 1 away from the control structure 3.

The other structures, materials and manufacturing processes of the display panel of the present embodiment are the same as those of any of the embodiments 1-2, which are not described redundantly herein.

Embodiment 4

Figure 6:
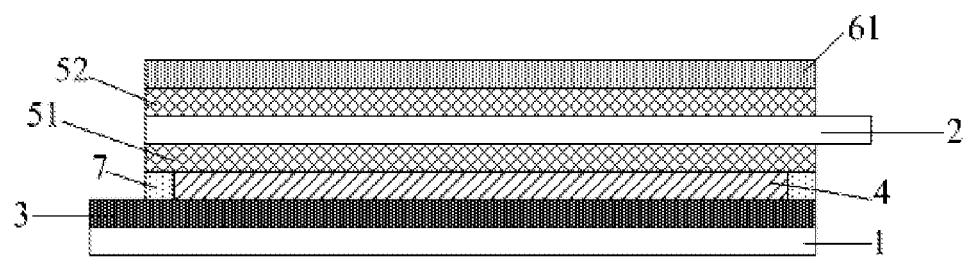
FIG. 6 is a sectional view of a display panel according to the embodiment 4 of the present invention.

The embodiment provides a display panel, which differs from any of the embodiments 1-3 in that, in the display panel of the present embodiment, as shown in FIG. 6, the sensing structure comprises a first sensing structure 51 and a second sensing structure 52. Both of the first sensing structure 51 and the second sensing structure 52 are arranged in an upper base plate, the first sensing structure 51 is located at a side of the second substrate 2 close to the display structure 4, and the second sensing structure 52 is located at a side of the second substrate 2 away from the display structure 4. The second sensing structure 52 and the first sensing structure 51 have the same structure.

Two sensing structures are arranged in the display panel of the embodiment, which enables the display panel to be more sensitive in touch control and capable of spending a shorter time to achieve a touch control, and capable of realizing multi-point touch control, thus increasing the touch control efficiency of the display panel and realizing diversified touch control.

The embodiment further provides a manufacturing method for the display panel above, which differs from the manufacturing method in any of the embodiments 1-3 in that, in the manufacturing method of the present embodiment, on the basis that the upper base plate and the lower base plate are completely prepared respectively in the embodiment 1 (wherein the first sensing structure 51 is formed at the side of the second substrate 2 close to the display structure 4), and after the upper base plate and the lower base plate are aligned to form a cell, and the first substrate and the second substrate are thinned by a chemical thinning process, the other sensing structure, that is, the second sensing structure 52 is further formed at the side of the second substrate 2 away from the display structure 4. Then, the upper polarization sheet 61 is formed on the second sensing structure 52.

The other structures, materials and manufacturing processes of the display panel of the present embodiment are the same as those of any of the embodiments 1-3, which are not described redundantly herein.

Embodiment 5

Figure 7:
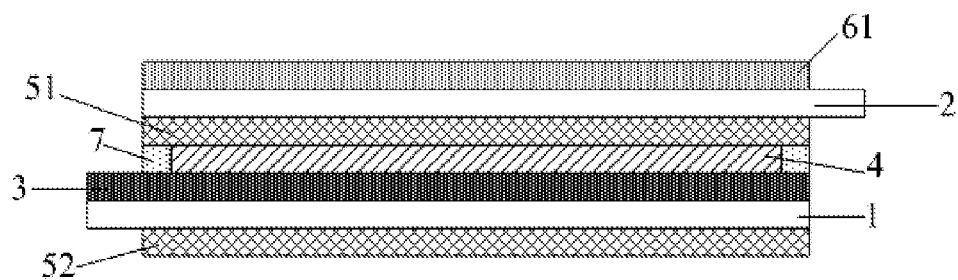
FIG. 7 is a sectional view of a display panel according to the embodiment 5 of the present invention.

The embodiment provides a display panel, which differs from the embodiment 4 in that, in the display panel of the present embodiment, as shown in FIG. 7, a first sensing structure 51 is arranged in the upper base plate, and arranged at a side of the second substrate 2 close to the display structure 4. A second sensing structure 52 is arranged in the lower base plate, and arranged at a side of the first substrate 1 away from the display structure 4.

The embodiment further provides a manufacturing method for the display panel above, which differs from the manufacturing method in the embodiment 4 in that, in the manufacturing method of the present embodiment, on the basis that the upper base plate and the lower base plate are completely prepared respectively in the embodiment 1 (wherein the first sensing structure 51 is formed at the side of the second substrate 2 close to the display structure 4), and after the upper base plate and the lower base plate are aligned to form a cell, and the first substrate and the second substrate are thinned by a chemical thinning process, the other sensing structure, that is, the second sensing structure 52 is formed at the side of the first substrate 1 away from the display structure 4.

The other structures, materials and manufacturing processes of the display panel of the present embodiment are the same as those of the embodiment 4, which are not described redundantly herein.

Embodiment 6

Figure 8:
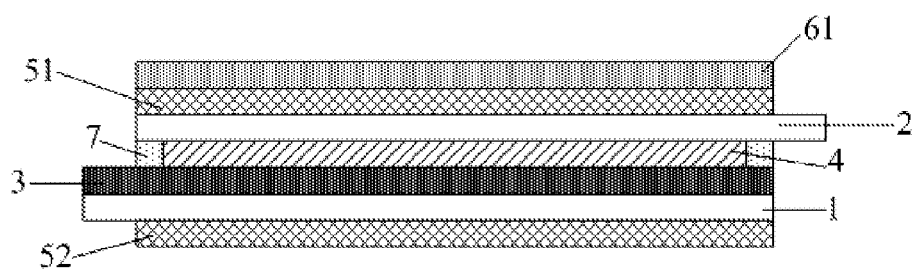
FIG. 8 is a sectional view of a display panel according to the embodiment 6 of the present invention.

The embodiment provides a display panel, which differs from the embodiment 5 in that, in the display panel of the present embodiment, as shown in FIG. 8, a first sensing structure 51 is arranged in an upper base plate, and arranged at a side of the second substrate 2 away from the display structure 4, and a second sensing structure 52 is arranged in a lower base plate, and arranged at a side of the first substrate 1 away from the display structure 4.

The embodiment further provides a manufacturing method for the display panel above, which differs from the manufacturing method in any of the embodiments 4-5 in that, in the manufacturing method of the present embodiment, before the first sensing structure 51 is formed at the side of the second substrate 2 away from the display structure 4, and the second sensing structure 52 is formed at the side of the first substrate 1 away from the display structure 4, the upper base plate which is partially prepared (that is, the first sensing structure 51 is not formed in the upper base plate, and only the second substrate 2 is arranged in the upper base plate) is first aligned with the lower base plate, which is not completely prepared (that is, a control structure 3 and a display structure 4 are already formed in the lower base plate, but the second sensing structure 52 is not formed), to form a cell, and after the first substrate and the second substrate are thinned by a chemical thinning process, the first sensing structure 51 is then formed at the side of the second substrate 2 away from the display structure 4, and the second sensing structure 52 is formed at the side of the first substrate 1 away from the display structure 4. Then, an upper polarization sheet 61 is formed on the first sensing structure 51.

The other structures, materials and manufacturing processes of the display panel of the present embodiment are the same as those of any of the embodiments 4-5, which are not described redundantly herein.

Embodiment 7

Figure 9:
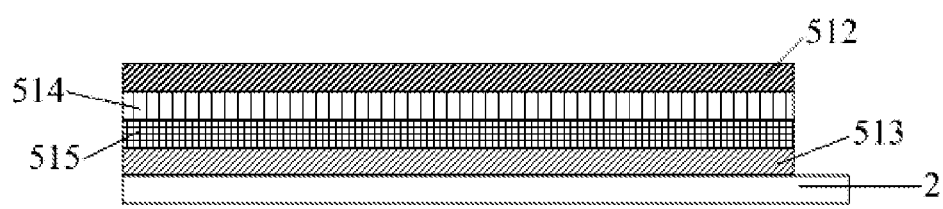
FIG. 9 is a sectional view of the sensing structure of a display panel according to the embodiment 7 of the present invention.

The embodiment provides a display panel, which differs from the embodiments 1 to 6 in that, in the display panel of the present embodiment, as shown in FIG. 9, a first sensing structure and a second sensing structure comprise: two split sensing film layers (that is, a first split sensing film layer 513 and a second split sensing film layer 514) and a stabilizer sub-structure 512 which are sequentially arranged in a direction away from the first substrate (not shown in FIG. 9) or the second substrate 2. An insulation layer 515 is further arranged between the two split sensing film layers. The two split sensing film layers may be produced from carbon nanotubes and indium tin oxide respectively, or produced from carbon nanotubes and graphene respectively. The stabilizer sub-structure 512 may be a protection layer formed from an organic material. The insulation layer 515 may be formed from an insulation material capable of mutually insulating the two split sensing film layers.

By arranging the two split sensing film layers in the sensing structure, the sensing structure is more sensitive in response during touch control, thus increasing the touch control efficiency of the display panel.

Correspondingly, in the present embodiment, the manufacturing process for the sensing structure is also different from the manufacturing process for the sensing structure in the embodiments 1-6. In the present embodiment, the formation step of the sensing structure may comprise the following steps S50'-S53'.

Step S50': forming a pattern comprising the first split sensing film layer 513 by an indium tin oxide material or graphene through a patterning process.

Step S51': forming the insulation layer 515 above the first split sensing film layer 513 through applying.

Next, a pre-baking step is carried out, a pre-baking temperature range is 60-90° C., and a pre-baking time range is 2-3 minutes. The pre-baking is capable of reducing water in the insulation layer, thus facilitating the subsequent manufacturing for a sensing structure.

Step S52': forming a pattern comprising the second split sensing film layer 514 above the insulation layer 515 by a carbon nanotube material through a drawing process.

Next, a post-baking step is carried out, a post-baking temperature range is 80-120° C., and a post-baking time range is 15-30 minutes. The post-baking is capable of reducing water in the second split sensing film layer 514, thus facilitating curing of the second split sensing film layer 514 and even the whole sensing structure.

Step S53': forming the protection layer above the second split sensing film layer 514 through applying an organic material.

It needs to be illustrated that, preferably, both of the pre-baking step and the post-baking step are set during the manufacturing process; however, the pre-baking step and the post-baking step also may be not set, or one of the pre-baking step and the post-baking step is carried out according to an actual manufacturing process.

The other structures, materials and manufacturing processes of the display panel of the present embodiment are the same as those of any of the embodiments 1-6, which are not described redundantly herein.

Embodiment 8

Figure 10:
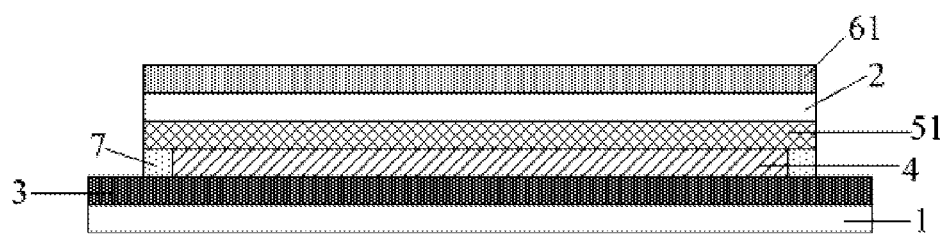
FIG. 10 is a sectional view of a display panel according to the embodiment 8 of the present invention.

The embodiment provides a display panel, which differs from the embodiments 1 to 7 in that, in the display panel of the present embodiment, as shown in FIG. 10, the length and the width of the lower base plate are greater than the length and the width of the upper base plate, thus after the upper base plate and the lower base plate are aligned to form a cell, the non-display area of the lower base plate is exposed, and the peripheral circuits (not shown in FIG. 10) are arranged in the exposed non-display area of the lower base plate.

It needs to be illustrated that, the length or the width of the lower base plate may be greater than the length or the width of the upper base plate; or the length and/or the width of the upper base plate may be greater than the length and/or the width of the lower base plate, and regarding the later, the peripheral circuits are arranged in the exposed non-display area of the upper base plate.

The other structures, materials and manufacturing processes of the display panel of the present embodiment are the same as those of any of the embodiments 1-7, which are not described redundantly herein.

Embodiment 9

The embodiment provides a display panel, which differs from the embodiments 1 to 8 in that, in the display panel of the present embodiment, the display structure is a liquid crystal layer, and the liquid crystal layer is arranged above the control structure (for example, a thin film transistor layer). The liquid crystal layer is formed by filling liquid crystal in a gap formed by aligning the upper base plate and the lower base plate to form a cell. In addition, an upper polarization sheet is arranged at a side of the upper base plate away from the display structure, a lower polarization sheet is further arranged at a side of the lower base plate away from the display structure, both of the upper polarization sheet and the lower polarization sheet are linear polarization sheets, and the polarization directions of the upper polarization sheet and the lower polarization sheet are mutually vertical.

Correspondingly, the manufacturing process for the display panel above differs from the embodiments 1 to 8 in that, during the manufacturing process for the lower base plate, a pattern comprising the control structure is formed on a first substrate at first, and then a frame-sealing material is applied in the edge area of the non-display area of the lower base plate, next, liquid crystal is dripped in the display area of the lower base plate.

The other structures, materials and manufacturing processes of the display panel of the present embodiment are the same as those of any of the embodiments 1-8, which are not described redundantly herein.

According to the display panel provided by the present invention, by arranging the stabilizer sub-structure in the sensing structure, the display panel is free from internal or external electromagnetic interference, and the sensing film layer in the sensing structure is protected from damages due to a collision, thus the display panel with the touch control function is more stable in performance. In addition, by thinning the substrates of the upper base plate and the lower base plate in the display panel through the chemical thinning process, the thinness of the display panel can also be realized. The display panel provided by the present invention has a low cost, and moreover, the development of the display panel with a low cost and a thin thickness is prompted.

Embodiment 10

The embodiment provides a display device, comprising the display panel of any of the embodiments 1 to 9.

According to the display device, by adopting a sensing structure provided with a stabilizer sub-structure, the display device with a touch control function is more stable in performance.

The display device may be: any product or component with a display function, such as a liquid crystal panel, electronic paper, an OLED panel, a mobile phone, a tablet personal computer, a television, a display, a notebook computer, a digital photo frame and a navigator.

It may be understood that, the foregoing implementations are merely specific implementations adopted for illustrating the principle of the present invention, but the present invention is not limited thereto. Some technical features in the technical features above may be omitted in the embodiments of the present invention, and only a part of technical problems existing in the prior art are solved, and moreover, the disclosed technical features may be randomly combined. Any variations and improvements could be made by those of ordinary skill in the art without departing from the spirit and essence of the present invention, but these variations and improvements are still encompassed in the protection scope of the present invention. The scope of the present invention is defined by the appended claims.

The invention claimed is:

1. A display panel, which is divided into display areas and non-display areas, comprising:
   an upper base plate comprising a second substrate; and
   a lower base plate aligned with the upper base plate to form a cell, a control structure and a display structure being arranged in the display area of the lower base plate, wherein the lower base plate comprises a first substrate, the control structure is arranged above the first substrate, and the display structure is arranged above the control structure, wherein a sensing structure is further arranged in the display area of the lower base plate, the sensing structure and the display structure are correspondingly arranged, and a stabilizer sub-structure is arranged in the sensing structure, and wherein the sensing structure comprises a first sensing structure arranged in the display area, the first sensing structure being located at a side of the first substrate away from the display structure, wherein the display panel further comprises peripheral circuits, wherein, the display area of the upper base plate and the display area of the lower base plate have the same dimension, the non-display area of the upper base plate and the non-display area of the lower base plate also have the same dimension, and moreover, the non-display area is only arranged at one side of the display area, and the upper base plate and the lower base plate are arranged in a staggered manner, thus the display area of the upper base plate corresponds to the display area of the lower base plate in an orthographic projection direction, the non-display area of the upper base plate and the non-display area of the lower base plate are exposed at two opposite sides, and the peripheral circuits are arranged in the exposed non-display areas.

2. A display device, comprising the display panel according to claim 1.

3. The display panel according to claim 1, wherein the first sensing structure comprise a sensing film layer and the stabilizer sub-structure which are sequentially arranged in a direction away from the first substrate, wherein the sensing film layer is formed from carbon nanotubes or an indium tin oxide material, and the stabilizer sub-structure is a protection layer formed from an organic material;

or, the first sensing structure comprise: two split sensing film layers and the stabilizer sub-structure which are sequentially arranged in a direction away from the first substrate, wherein an insulation layer is further arranged between the two split sensing film layers, the two split sensing film layers are formed from carbon nanotubes and an indium tin oxide material respectively, or formed from carbon nanotubes and a graphene material respectively, the stabilizer sub-structure is a protection layer formed from an organic material, and the insulation layer is formed from an insulation material capable of making the two split sensing film layers mutually insulated.

4. A manufacturing method for the display panel of claim 1, the manufacturing method comprising following steps:

forming an upper base plate comprising a second substrate;

forming a lower base plate comprising a first substrate; and aligning the upper base plate and the lower base plate to form a cell so as to form the display panel, wherein a control structure and a display structure are formed in the display area on the lower base plate, the control structure is arranged above the first substrate, and the display structure is arranged above the control structure, wherein a sensing structure is further arranged in the display area of the lower base plate, the sensing structure and the display structure are correspondingly arranged, and a stabilizer sub-structure is arranged in the sensing structure, and wherein the sensing structure comprises a first sensing structure arranged in the display area, the first sensing structure being located at a side of the first substrate away from the display structure, wherein the display panel further comprises peripheral circuits, wherein, the display area of the upper base plate and the display area of the lower base plate have the same dimension, the non-display area of the upper base plate and the non-display area of the lower base plate also have the same dimension, and moreover, the non-display area is only arranged at one side of the display area, and the upper base plate and the lower base plate are arranged in a staggered manner, thus the display area of the upper base plate corresponds to the display area of the lower base plate in an orthographic projection direction, the non-display area of the upper base plate and the non-display area of the lower base plate are exposed at two opposite sides, and the peripheral circuits are arranged in the exposed non-display areas.

5. A display panel, which is divided into display areas and non-display areas, comprising:

an upper base plate comprising a second substrate, and a lower base plate aligned with the upper base plate to form a cell, a control structure and a display structure being arranged in the display area of the lower base plate, wherein the lower base plate comprises a first substrate, the control structure is arranged above the first substrate, the display structure is arranged above the control structure, and wherein, the display panel further comprises a sensing structure arranged in the display area so as to correspond to the display structure, a stabilizer sub-structure is arranged in the sensing structure, the sensing structure comprises a first sensing structure and a second sensing structure, both of the first sensing structure and the second sensing structure being arranged on the upper base plate, the first sensing structure being located at the side of the second substrate close to the display structure, and the second sensing structure being located at the side of the second substrate away from the display structure;

or, the display panel further comprises a sensing structure arranged in the display area so as to correspond to the display structure, a stabilizer sub-structure is arranged in the sensing structure, the sensing structure comprises a first sensing structure and a second sensing structure, the first sensing structure being arranged on the upper base plate, and located at the side of the second substrate away from the display structure or at the side of the second substrate close to the display structure, and the second sensing structure being arranged on the lower base plate, and located at the side of the first substrate away from the display structure, wherein the display panel further comprises peripheral circuits, wherein, the display area of the upper base plate and the display area of the lower base plate have the same dimension, the non-display area of the upper base plate and the non-display area of the lower base plate also have the same dimension, and moreover, the non-display area is only arranged at one side of the display area, and the upper base plate and the lower base plate are arranged in a staggered manner, thus the display area of the upper base plate corresponds to the display area of the lower base plate in an orthographic projection direction, the non-display area of the upper base plate and the non-display area of the lower base plate are exposed at two opposite sides, and the peripheral circuits are arranged in the exposed non-display areas.

6. The display panel according to claim 5, wherein the control structure is a thin film transistor layer, and the display structure is an organic light emitting layer or a liquid crystal layer.

7. The display panel according to claim 6, wherein the first sensing structure and the second sensing structure comprise a sensing film layer and the stabilizer sub-structure which are sequentially arranged in a direction away from the first substrate or the second substrate, wherein the sensing film layer is formed from carbon nanotubes or an indium tin oxide material, and the stabilizer sub-structure is a protection layer formed from an organic material;

or, the first sensing structure and the second sensing structure comprise: two split sensing film layers and the stabilizer sub-structure which are sequentially arranged in a direction away from the first substrate or the second substrate, wherein an insulation layer is further arranged between the two split sensing film layers, the two split sensing film layers are formed from carbon nanotubes and an indium tin oxide material respectively, or formed from carbon nanotubes and a graphene material respectively, the stabilizer sub-structure is a protection layer formed from an organic material, and the insulation layer is formed from an insulation material capable of making the two split sensing film layers mutually insulated.

8. The display panel according to claim 7, wherein an upper polarization sheet is arranged at a side of the upper base plate away from the display structure, or, a lower polarization sheet is arranged at a side of the lower base plate away from the display structure, or, an upper polarization sheet is arranged at a side of the upper base plate away from the display structure and a lower polarization sheet is arranged at a side of the lower base plate away from the display structure.

9. The display panel according to claim 5, wherein the first substrate and the second substrate are formed from a transparent glass material, the first substrate and/or the second substrate is subjected to thinning treatment through a chemical thinning process, and the thickness range of the first substrate and the second substrate is 0.1-0.3 mm.

10. The display panel according to claim 6, wherein the organic light emitting layer at least comprises an anode layer, a light emitting layer and a cathode layer; the liquid crystal layer is formed by filling liquid crystal in a gap formed by aligning the upper base plate and the lower base plate to form a cell.

11. A manufacturing method for the display panel of claim 2, the manufacturing method comprising following steps:

forming an upper base plate comprising a second substrate;

forming a lower base plate comprising a first substrate; and aligning the upper base plate and the lower base plate to form a cell so as to form the display panel, wherein a control structure and a display structure are formed in the display area on the lower base plate, the control structure is arranged above the first substrate, and the display structure is arranged above the control structure, wherein, the display panel further comprises a sensing structure arranged in the display area so as to correspond to the display structure, a stabilizer sub-structure is arranged in the sensing structure, the sensing structure comprises a first sensing structure and a second sensing structure, both of the first sensing structure and the second sensing structure being arranged on the upper base plate, the first sensing structure being located at the side of the second substrate close to the display structure, and the second sensing structure being located at the side of the second substrate away from the display structure;

or, the display panel further comprises a sensing structure arranged in the display area so as to correspond to the display structure, a stabilizer sub-structure is arranged in the sensing structure, the sensing structure comprises a first sensing structure and a second sensing structure, the first sensing structure being arranged on the upper base plate, and located at the side of the second substrate away from the display structure or at the side of the second substrate close to the display structure, and the second sensing structure being arranged on the lower base plate, and located at the side of the first substrate away from the display structure, wherein the display panel further comprises peripheral circuits, wherein, the display area of the upper base plate and the display area of the lower base plate have the same dimension, the non-display area of the upper base plate and the non-display area of the lower base plate also have the same dimension, and moreover, the non-display area is only arranged at one side of the display area, and the upper base plate and the lower base plate are arranged in a staggered manner, thus the display area of the upper base plate corresponds to the display area of the lower base plate in an orthographic projection direction, the non-display area of the upper base plate and the non-display area of the lower base plate are exposed at two opposite sides, and the peripheral circuits are arranged in the exposed non-display areas.

12. The manufacturing method according to claim 11, wherein the step of forming the lower base plate specifically comprises:

preparing a first substrate; and forming a pattern comprising the control structure on the first substrate;

or, after the step of forming a pattern comprising the control structure, the manufacturing method further comprises: forming a pattern comprising the sensing structure at a side of the first substrate away from the control structure.

13. The manufacturing method according to claim 12, wherein the step of forming the upper base plate specifically comprises:

preparing a second substrate, or, the manufacturing method further comprises: forming a pattern comprising the sensing structure at one side or both sides of the prepared second substrate.

14. The manufacturing method according to claim 13, wherein the step of forming the display panel specifically comprises:

applying a frame-sealing material in the edge area of the non-display area of the lower base plate or the upper base plate;

aligning the upper base plate with the lower base plate to form a cell after applying the frame-sealing material;

attaching polarization sheets at the outer sides of the upper base plate and/or the lower base plate respectively; and attaching peripheral circuits in the exposed non-display areas of the upper base plate and/or the lower base plate.

15. The manufacturing method according to claim 14, wherein the control structure is a thin film transistor layer, the display structure is an organic light emitting layer, and after the step of forming a pattern comprising the control structure, the manufacturing method further comprises: forming the organic light emitting layer above the control structure in a vacuum evaporation environment by means of evaporation;

or, the display structure is a liquid crystal layer, and after the step of applying the frame-sealing material and before the step of aligning the upper base plate and the lower base plate to form a cell, the manufacturing method further comprises: dripping liquid crystal in the display area of the upper base plate or the lower base plate.

16. The manufacturing method according to claim 14, wherein the step of forming the display panel further comprises: after aligning the upper base plate and the lower base plate to form a cell and before forming the sensing structure at the side of the first substrate away from the display structure and/or forming the sensing structure at a side of the second substrate away from the display structure, a step of thinning the side of the first substrate away from the display structure in the lower base plate and/or the side of the second substrate away from the display structure in the upper base plate, and the thinning step specifically comprises:

applying a protection material in the non-display areas between the upper base plate and the lower base plate, wherein the protection material is a thermocuring material or a photocuring material;

thinning the side of the first substrate away from the display structure in the lower base plate and/or the side of the second substrate away from the display structure in the upper base plate by a chemical thinning process; and removing the protection material.

17. The manufacturing method according to claim 11, wherein the sensing structure comprises a sensing film layer and a stabilizer sub-structure which are sequentially arranged in a direction away from the first substrate or the second substrate, the stabilizer sub-structure being a protection layer formed from an organic material, and the step of forming the sensing structure comprises:

forming a pattern comprising the sensing film layer by carbon nanotubes through a drawing process; or forming a pattern comprising the sensing film layer by an indium tin oxide material through a patterning process; and applying an organic material on the sensing film layer to form the protection layer;

or, the sensing structure comprise two split sensing film layers and the stabilizer sub-structure which are sequentially arranged in a direction away from the first substrate or the second substrate, the stabilizer sub-structure being a protection layer formed from an organic material, an insulation layer being further arranged between the two split sensing film layers, and the step of forming the sensing structure comprises:

forming a pattern comprising a first split sensing film layer by an indium tin oxide material or graphene through a patterning process;

forming the insulation layer above the first split sensing film layer through applying;

forming a pattern comprising a second split sensing film layer above the insulation layer by a carbon nanotube material through a drawing process; and forming the protection layer above the second split sensing film layer through applying an organic material.

18. The manufacturing method according to claim 17, wherein before the step of forming the pattern comprising the second split sensing film layer, the manufacturing method further comprises a pre-baking step, wherein a pre-baking temperature range is 60-90° C., and a pre-baking time range is 2-3 minutes;

and/or after the step of forming the pattern comprising the second split sensing film layer, the manufacturing method further comprises a post-baking step, wherein a post-baking temperature range is 80-120° C., and a post-baking time range is 15-30 minutes.

19. A display device, comprising the display panel according to claim 5.

* * * * *